(12) United States Patent
Shen et al.

(10) Patent No.: US 9,992,856 B2
(45) Date of Patent: Jun. 5, 2018

(54) SOLUTION FOR EUV POWER INCREMENT AT WAFER LEVEL

(71) Applicant: Taiwan Semiconductor Manufacturing Co., Ltd., Hsin-Chu (TW)

(72) Inventors: En-Chao Shen, Hsinchu (TW); Yiming Chiu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/251,609

(22) Filed: Aug. 30, 2016

(65) Prior Publication Data

US 2017/0019981 A1 Jan. 19, 2017

Related U.S. Application Data

(63) Continuation of application No. 14/798,646, filed on Jul. 14, 2015, now Pat. No. 9,451,683.

(51) Int. Cl.
*H05G 2/00* (2006.01)
*G02B 19/00* (2006.01)
*G03F 7/20* (2006.01)
*G21K 1/06* (2006.01)
*H01S 3/223* (2006.01)

(52) U.S. Cl.
CPC ........ *H05G 2/003* (2013.01); *G02B 19/0095* (2013.01); *G03F 7/70025* (2013.01); *G21K 1/067* (2013.01); *H01S 3/2232* (2013.01); *H05G 2/005* (2013.01); *H05G 2/006* (2013.01); *H05G 2/008* (2013.01)

(58) Field of Classification Search
CPC ...................................................... H05G 2/00
USPC .................................................... 250/504 R
See application file for complete search history.

(56) References Cited

U.S. PATENT DOCUMENTS

| 7,622,727 B2 * | 11/2009 | Shirai .................... B82Y 10/00 250/423 R |
|---|---|---|
| 7,655,925 B2 | 2/2010 | Bykanov et al. |
| 8,283,643 B2 | 10/2012 | Partlo et al. |
| 8,507,882 B2 | 8/2013 | Swinkels et al. |
| 8,519,366 B2 | 8/2013 | Bykanov et al. |
| 8,569,721 B2 | 10/2013 | Nakano et al. |

(Continued)

OTHER PUBLICATIONS

Notice of Allowance dated May 26, 2016 for U.S. Appl. No. 14/798,646.

*Primary Examiner* — Phillip A Johnston
(74) *Attorney, Agent, or Firm* — Eschweiler & Potashnik, LLC

(57) ABSTRACT

The present disclosure relates to a photolithography radiation source having an angled primary laser, and an associated method of formation. In some embodiments, the photolithography radiation source has a fuel droplet generator that provides fuel droplets to a source vessel along a first trajectory. A primary laser is configured to generate a primary laser beam along a second trajectory that intersects the first trajectory. The primary laser beam is configured to ignite a plasma from the plurality of fuel droplets that emits radiation. A collector mirror is configured to focus the radiation to an exit aperture of the source vessel. The primary laser beam does not intersect the exit aperture.

20 Claims, 5 Drawing Sheets

(56) References Cited

U.S. PATENT DOCUMENTS

| | | | |
|---|---|---|---|
| 8,759,804 B2 * | 6/2014 | Nishisaka | G03B 27/54 |
| | | | 250/504 R |
| 8,791,440 B1 | 7/2014 | Tao et al. | |
| 8,809,823 B1 | 8/2014 | Senekerimyan et al. | |
| 8,901,521 B2 | 12/2014 | Van Empel et al. | |
| 9,072,152 B2 | 6/2015 | Wakabayashi et al. | |
| 9,232,623 B2 | 1/2016 | Rafac et al. | |
| 9,241,395 B2 | 1/2016 | Senekerimyan et al. | |
| 9,271,381 B2 | 2/2016 | Fleurov | |
| 9,338,870 B2 | 5/2016 | Tao et al. | |
| 2006/0255298 A1 | 11/2006 | Bykanov et al. | |
| 2010/0181503 A1 | 7/2010 | Yanagida et al. | |
| 2014/0084183 A1 * | 3/2014 | Wakabayashi | H05G 2/008 |
| | | | 250/492.1 |
| 2015/0034845 A1 | 2/2015 | Shu | |
| 2015/0264791 A1 * | 9/2015 | Nikipelov | H05G 2/005 |
| | | | 250/504 R |

* cited by examiner

SOLUTION FOR EUV POWER INCREMENT AT WAFER LEVEL

REFERENCE TO RELATED APPLICATION

This Application is a Continuation of U.S. application Ser. No. 14/798,646 filed on Jul. 14, 2015, the contents of which is hereby incorporated by reference in its entirety.

BACKGROUND

Photolithography is a process by which a photomask having a pattern is irradiated with light to transfer the pattern onto a photosensitive material overlying a semiconductor substrate. Over the history of the semiconductor industry, smaller integrated chip minimum features sizes have been achieved by reducing the exposure wavelength of optical lithography radiation sources to improve photolithography resolution. Extreme ultraviolet (EUV) lithography, which uses extreme ultraviolet (EUV) light having an exposure wavelength of between 10 nm and 130 nm, is a promising next-generation lithography solution for emerging technology nodes (e.g., 22 nm, 14 nm, 10 nm, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
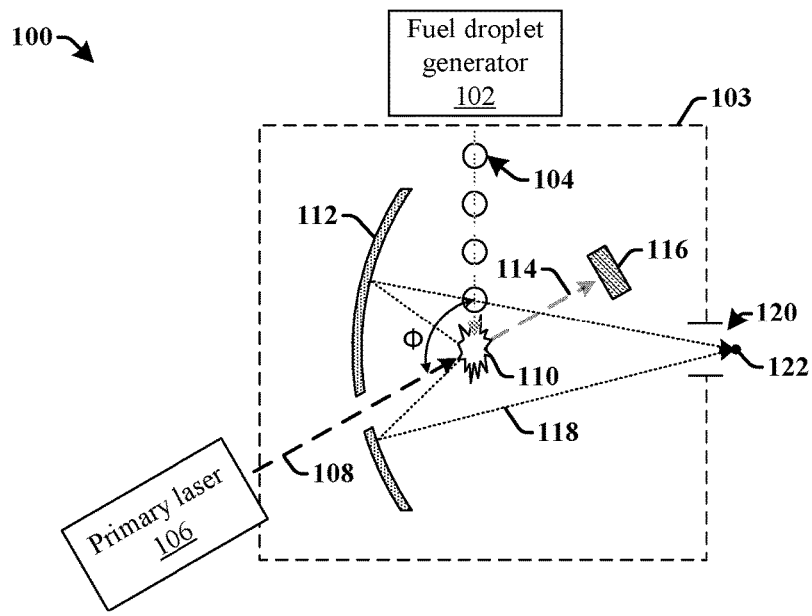
FIG. 1 illustrates a block diagram of some embodiments of an extreme ultraviolet (EUV) radiation source having an angled primary laser.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) photolithography systems generally use extreme ultraviolet radiation having a 13.5 nm wavelength. One method of producing 13.5 nm wavelength radiation that has recently emerged is to shot a carbon dioxide ($CO_2$) laser beam at droplets of tin (Sn). The tin droplets are typically provided into an EUV source vessel. As the droplets enter the EUV source vessel, the $CO_2$ laser beam hits the tin droplets and heats the tin droplets to a critical temperature that causes atoms of tin to shed their electrons and become a plasma of ionized tin droplets. The ionized tin droplets emit photons having a wavelength of approximately 13.5 nm, which is provided as EUV radiation to a scanner having downstream optics configured to focus the EUV radiation onto a workpiece.

Typically, the primary laser used to ignite the plasma from the tin droplets is aimed along an axis that is coincident with an axis to which EUV radiation is sent to the downstream optics. To prevent the $CO_2$ laser beam from entering into the downstream optics, and damaging optical components, a protection bar is typically designed in a center of an intermediate focus unit located between the EUV source vessel and the scanner. The protection bar is designed to block the $CO_2$ laser beam from entering the downstream optics. However, the protection bar also stands in a portion of the path of the EUV radiation, thereby reducing the power of the EUV system. For example, the protection bar may reduce a cross-section of the EUV radiation entering into the downstream optics by around 15%, thereby reducing power output from the EUV radiation source by approximately 15%.

Accordingly, the present disclosure relates to an EUV radiation source having an angled primary laser beam configured to generate improved EUV power, and an associated method. In some embodiments, the EUV radiation source comprises a fuel droplet generator that provides a plurality of fuel droplets to an EUV source vessel along a first trajectory. A primary laser is configured to generate a primary laser beam along a second trajectory that intersects the first trajectory at a non-perpendicular angle. The primary laser beam has a sufficient energy to ignite a plasma that emits EUV radiation from the plurality of fuel droplets. A collector mirror, located between the laser and the first trajectory, has a concave curvature configured to focus the EUV radiation to an exit aperture of the EUV source vessel that is not linearly aligned with the second trajectory of the primary laser beam. By changing the orientation of the primary laser beam to be angled with respect to the exit aperture, the protection element can be moved to a position that no longer blocks EUV radiation from entering into downstream EUV optics, thereby increasing the power output and throughput of an EUV photolithography system.

FIG. 1 illustrates a block diagram of some embodiments of an extreme ultraviolet (EUV) radiation source 100 having an angled primary laser.

The EUV radiation source 100 comprises a fuel droplet generator 102 configured to generate a plurality of fuel droplets 104. The plurality of fuel droplets 104 generated by the fuel droplet generator 102 are provided into an EUV source vessel 103 along a first trajectory. In some embodiments, the plurality of fuel droplets 104 may comprise tin (Sn). In other embodiments, the plurality of fuel droplets 104 may comprise a different metal material.

A primary laser 106 is configured to generate a primary laser beam 108 that intersects the fuel droplets 104. The primary laser beam 108 extends along a second trajectory that intersects the first trajectory at a non-perpendicular angle Φ. In various embodiments, the non-perpendicular angle Φ may be an obtuse angle (i.e., an angle greater than 90° and less than 180°) or an acute angle (i.e., an angle less than 90°). In some embodiments, the primary laser 106 may comprise a carbon dioxide ($CO_2$) laser. In other embodiments, the primary laser 106 may comprise alternative types of lasers.

When the primary laser beam 108 strikes the plurality of fuel droplets 104, the primary laser beam 114 heats the plurality of fuel droplets 104 to a critical temperature. At the critical temperature, the fuel droplets 104 shed their electrons and become a plasma 110 comprising a plurality of ions. The plurality of ions emit EUV radiation 118 (e.g., having a wavelength of approximately 13.5 nm) to a collector mirror 112 having a concave curvature that curves around the plasma 110. The collector mirror 112 is configured to focus the EUV radiation 118 to an exit aperture 120 of the EUV source vessel 103, which is not linearly aligned with the second trajectory of the primary laser beam 114 (e.g., to focus the EUV radiation 118 to a focal point 122 not intersecting a line of the primary laser beam 114).

A remnant of the primary laser beam 114 remaining after igniting the plasma 110 (i.e., after passing through the first trajectory of the plurality of fuel droplets 104) may extend along a line of the primary laser beam 108. A protection element 116 is configured to intersect the remnant of the primary laser beam 114. The protection element 116 is configured to absorb the remnant of the primary laser beam 114, so that the remnant of the primary laser beam 114 does not enter into and damage downstream optics. The protection element 116 is located along a line of the primary laser beam 114 (i.e., is linearly aligned with the primary laser beam 114) at a position that is external to a path of the EUV radiation 118 focused by the collector mirror 112 to the focal point 122 (e.g., outside an area defined by lines extending between edges of the collector mirror 112 and the focal point 122). By positioning the protection element 116 in an area that is outside of the path of the EUV radiation 118, the protection element 116 will not negatively impact the power of the EUV radiation 118. Therefore, EUV radiation source 100 is able to maximize the output power of the EUV radiation 118.

Figure 2A:
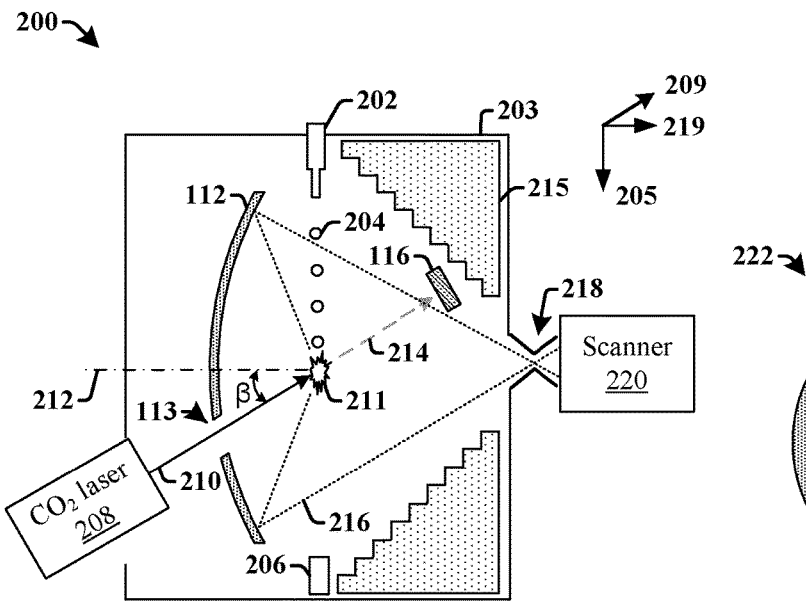
FIGS. 2A-2B illustrate some additional embodiments of an extreme ultraviolet (EUV) radiation source having an angled primary laser.

FIG. 2A illustrates a block diagram of some additional embodiments of an EUV radiation source 200 having an angled primary laser.

The EUV radiation source 200 comprises a tin droplet generator 202 configured to generate a plurality of tin droplets 204. The plurality of tin droplets 204 enter into an EUV source vessel 203 along a first trajectory extending in a first direction 205. The EUV source vessel 203 comprises a chamber held under vacuum (e.g., at a pressure of less than $10^{-2}$ mbar). In some embodiments, a tin droplet collection element 206 may be located below the tin droplet generator 202. The tin droplet collection element 206 is configured to collect tin droplets that are not vaporized during formation of the EUV radiation and/or fragments of tin droplets generated during formation of the EUV radiation.

A carbon dioxide ($CO_2$) primary laser 208 is configured to generate a primary laser beam 210. The primary laser beam 210 may comprise a plurality of pulses of infrared light. In some embodiments, the primary laser beam 210 may have principal wavelength bands centered around a range of between approximately 9 um and approximately 11 um and an energy of greater than or equal to approximately 11.9 MeV. The primary laser beam 210 follows a second trajectory extending along a second direction 209 that is not perpendicular to the first direction 205. The second trajectory extends through an opening 113 in a collector mirror 112 located within the EUV source vessel 203.

The primary laser beam 210 intersects the tin droplets 204 and generates a plasma 211 that emits EUV radiation 216. In some embodiments, the EUV radiation 216 may have a wavelength of approximately 13.5 nm. In other embodiments, the EUV radiation 216 may have a wavelength of between greater than approximately 13.5 nm and less than approximately 100 nm. In yet other embodiments, the EUV radiation 216 may have a wavelength of between greater than approximately 10 nm and less than approximately 13.5 nm.

A remnant of the primary laser beam 214 remaining after igniting the plasma 211 (i.e., after passing through the first trajectory of the plurality of tin droplets 204) may extend along a line of the primary laser beam 210 to intersect a protection element 116 configured to absorb the remnant of the primary laser beam 214. In some embodiments, the protection element 116 may be located between the plasma 211 and a corrugated surface of a tin collection element 215 configured to collect tin droplets 204 atoms from the plasma 211. In some embodiments, the protection element 116 may comprise a bar shaped structure. In other embodiments, the protection element 116 may comprise alternative shapes (e.g., a circular shape). In various embodiments, the protection element 116 may comprise titanium (e.g., a titanium alloy), aluminum, etc.

The collector mirror 112 comprises a concave curvature configured to focus the EUV radiation 216 generated by the plasma 211 toward an intermediate focus (IF) 218 separated from the plasma 211 in a third direction 219 that is non-parallel to the second direction 209. The intermediate focus 218 is comprised within an exit aperture of the EUV source vessel 203 that is not linearly aligned with a second trajectory of the primary laser beam 210. The intermediate focus 218 is located between the EUV source vessel 203 and a scanner 220 comprising optical elements configured to direct the EUV radiation 216 to a workpiece (e.g., a semiconductor substrate). In some embodiments, the intermediate focus 218 may comprise a cone shaped aperture configured to provide for separation of pressures between the EUV source vessel 203 and the scanner 220.

Figure 2B:
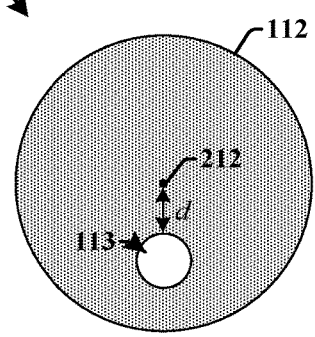

FIG. 2B illustrates a front-view 222 of the collector mirror 112 of FIG. 2A.

As shown in front-view 222, the opening 113 within the collector mirror 112 is offset from a center line 212 passing through a center of the collector mirror 112, so that the opening 113 is located at a position that is asymmetric with respect to the curvature of the collector mirror 112. The distance d between the center line 212 of the collector mirror 112 and the opening 113 depends upon an angle β between the center line 212 and the primary laser beam 210. For example, if the angle β is larger, the opening 113 will be at a greater distance d from the center line 212. In some embodiments, the collector mirror 112 may comprise a multi-layer coating having alternating layers of different materials. For example, in some embodiments, the collector mirror 112 may comprise alternating layers of molybdenum and silicon configured to operate as a Bragg reflector.

Figure 3:
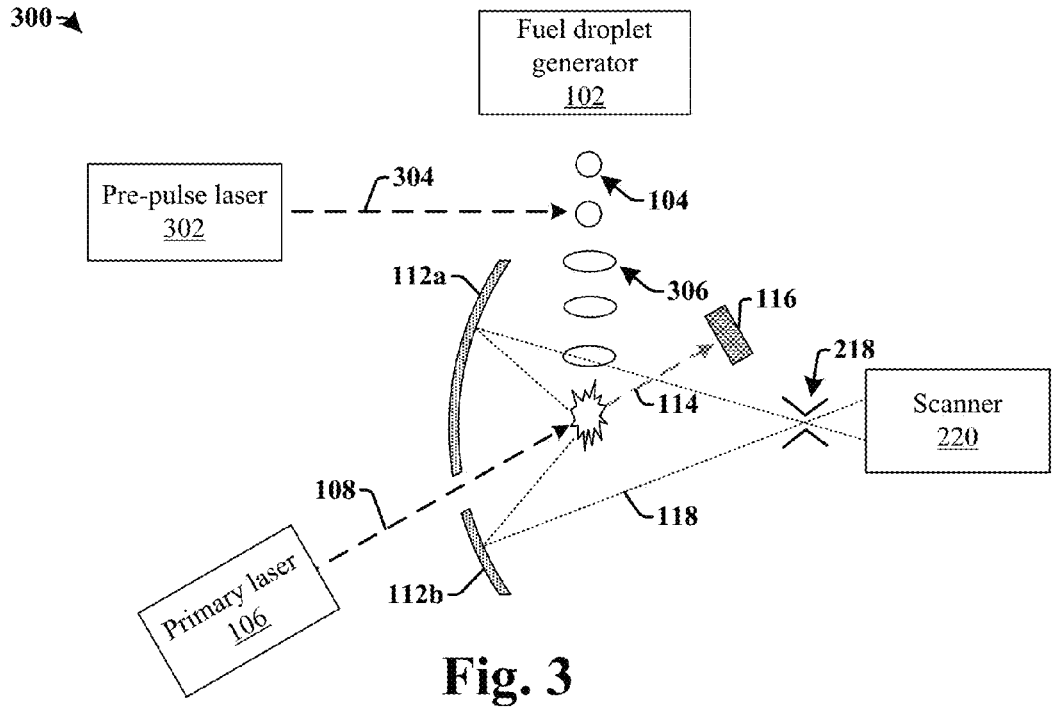
FIG. 3 illustrates a block diagram of some additional embodiments of an EUV radiation source having a pre-pulse laser.

FIG. 3 illustrates a block diagram of some additional embodiments of an extreme ultraviolet (EUV) radiation source 300 having a pre-pulse laser.

The EUV radiation source 300 comprises a pre-pulse laser 302 configured to generate a pre-pulse laser beam 304 that is incident on a plurality of fuel droplets 104 generated by a fuel droplet generator 102. The pre-pulse laser beam 304 has an energy that is less than a primary laser beam 108 generated by a primary laser 106. The energy of the pre-pulse laser beam 304 is insufficient to ignite a plasma from the fuel droplets 104 (e.g., is less than 11.9 MeV), but does deform the fuel droplets 104 (e.g., increase a target size/diameter of the tin droplets) to generate deformed fuel droplets 306. In some embodiments, the pre-pulse laser 302 may comprise a carbon-dioxide ($CO_2$) laser that has a lower energy than the primary laser 106.

Figure 4:
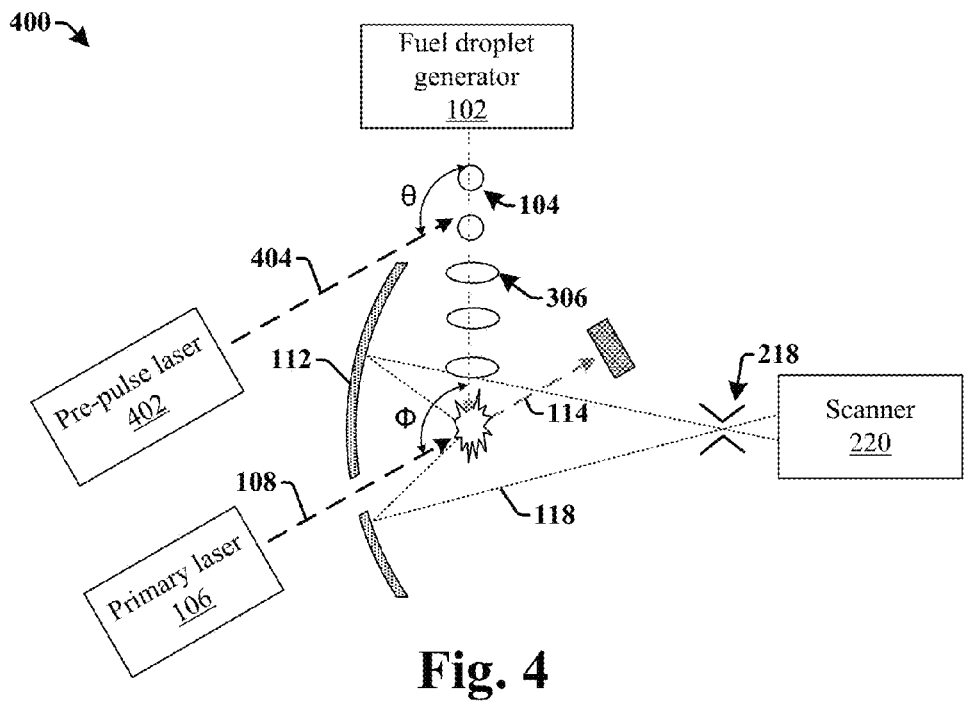
FIG. 4 illustrates a block diagram of some additional embodiments of an EUV radiation source having an angled pre-pulse laser.

FIG. 4 illustrates a block diagram of some additional embodiments of an extreme ultraviolet (EUV) radiation source 400 having an angled pre-pulse laser.

The EUV radiation source 400 comprises a fuel droplet generator 102 configured to provide a plurality of fuel droplets 104 along a first trajectory. A primary laser 106 is configured to generate a primary laser beam 108 that extends along a second trajectory that intersects the first trajectory at a first non-perpendicular angle Φ (e.g., an obtuse angle or an acute angle). An angled pre-pulse laser 402 is configured to generate a pre-pulse laser beam 404 that extends along a third trajectory that intersects the first trajectory at a second non-perpendicular angle ∂ (e.g., an obtuse angle or an acute angle). In some embodiments, the first non-perpendicular angle Φ is equal to the second non-perpendicular angle θ. In other embodiments, the first non-perpendicular angle Φ is different than the second non-perpendicular angle θ.

Figure 5:
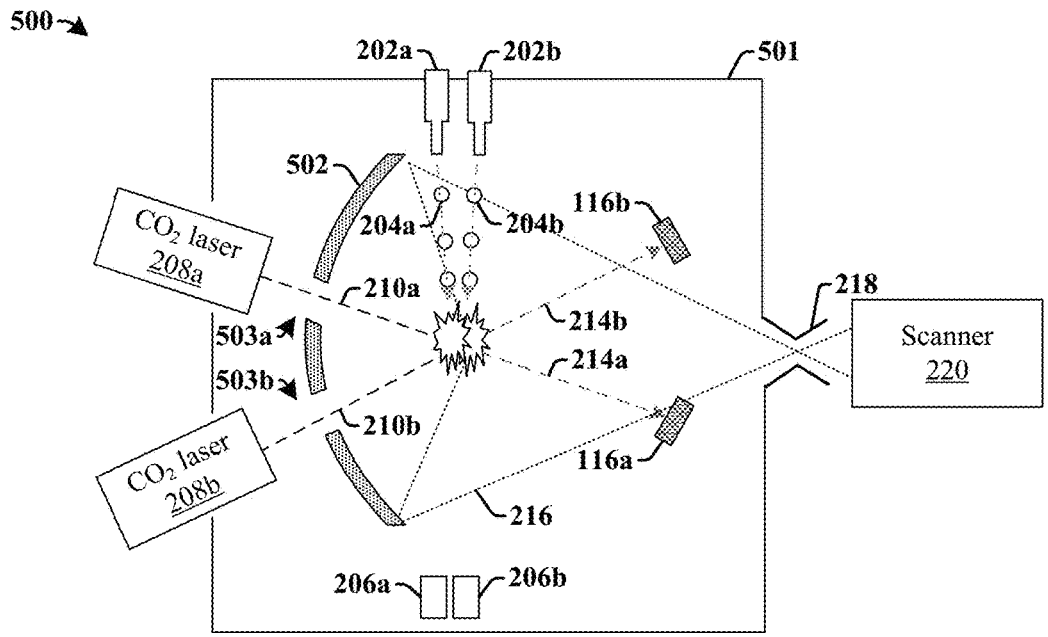
FIG. 5 illustrates a block diagram of some additional embodiments of an EUV radiation source having multiple angled primary lasers.

FIG. 5 illustrates a block diagram of some additional embodiments of an extreme ultraviolet (EUV) radiation source 500 having multiple fuel droplet generators and angled primary lasers. The use of multiple fuel droplet generators and angled primary lasers increases the amount of EUV radiation produced by the EUV radiation source 500, thereby improving the output power of the EUV radiation source 500.

The EUV radiation source 500 comprises a first tin droplet generator 202a and a second tin droplet generator 202b. The first tin droplet generator 202a is configured to generate a first plurality of tin droplets 204a that are provided to an EUV source vessel 501 along a first tin droplet trajectory. The second tin droplet generator 202b is configured to generate a second plurality of tin droplets 204b that are provided to the EUV source vessel 501 along a second tin droplet trajectory. In some embodiments, the first tin droplet generator 202a and the second tin droplet generator 202b are located at adjacent positions within a ceiling of the EUV source vessel 501.

In some embodiments, the first tin droplet generator 202a and the second tin droplet generator 202b, respectively comprise an internal chamber configured to hold a plurality of tin droplets. The internal chamber is separated from the EUV source vessel 501 by a valve, which upon opening releases one or more tin droplets into the EUV source vessel 501. The internal chamber may be held at a high internal pressure (e.g., greater than 100 atm), so that upon opening the valve, one or more tin droplets are injected into an EUV source vessel 501 along a tin droplet trajectory. By changing the pressure, the tin droplet trajectory may be adjusted. In some embodiments, the first tin droplet generator 202a and the second tin droplet generator 202b may have internal chambers with different pressures.

The EUV radiation source 500 further comprises a first $CO_2$ laser 208a configured to generate a first primary laser beam 210a, and a second $CO_2$ laser 208b configured to generate a second primary laser beam 210b. In some embodiments, the first primary laser beam 210a is provided through a first opening 503a in a collector mirror 502, while the second primary laser beam 210b is provided though a second opening 503b in the collector mirror 502. In some embodiments, a trajectory of the first primary laser beam 210a is different than a trajectory of the second primary laser beam 210b. In other embodiments, the trajectories of the first primary laser beam 210a and the second primary laser beam 210b may be the same (i.e., parallel).

The first primary laser beam 210a is configured to intersect the first tin droplet trajectory of the first plurality of tin droplets 204a and the second primary laser beam 210b is configured to intersect the second tin droplet trajectory of the second plurality of tin droplets 204b. In some embodiments, the first primary laser beam 210a may intersect the first tin droplet trajectory along an obtuse angle, while the second primary laser beam 210b may intersect the second tin droplet trajectory along an acute angle.

The first primary laser beam 210a ignites a first plasma that emits EUV radiation 504 from one or more of the first plurality of tin droplets 204a. Similarly, the second primary laser beam 210b ignites a second plasma that also EUV radiation 504 from one or more of the second plurality of tin droplets 204b. The collector mirror 502 is positioned around the first and second plasmas and has a surface with a concave curvature that is configured to focus the EUV radiation 504 into a downstream intermediate focus 218.

A first protection element 116a is linearly aligned with the first primary laser beam 210a at a position that is external to a path of the EUV radiation 504 focused by the collector mirror 502 to the intermediate focus 218. The first protection element 116a is configured to absorb a remnant of the first primary laser beam 210a. A second protection element 116b is linearly aligned with the second primary laser beam 210b at a position that is external to the path of the EUV radiation 504 focused by the collector mirror 502 to the intermediate focus 218. The second protection element 116b is configured to absorb a remnant of the second primary laser beam 210b. In some embodiments, the first protection element 116a and the second protection element 116b may be arranged on opposing sides of the intermediate focus 218. In some embodiments, the first protection element 116a and the second protection element 116b may be symmetrically arranged around the intermediate focus 218.

Figure 6:
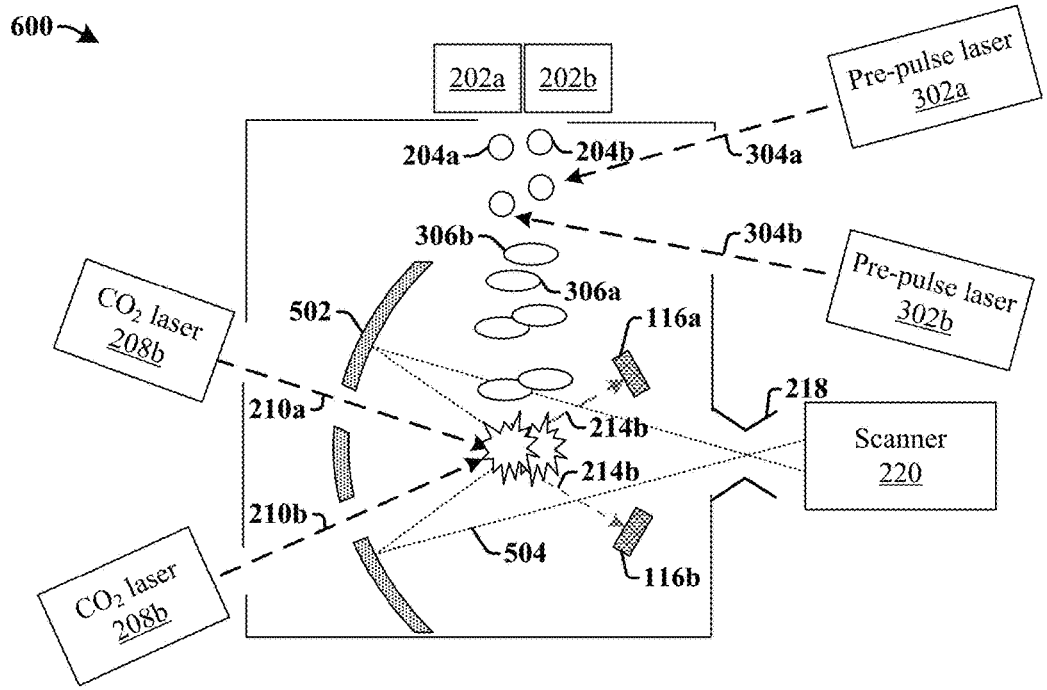
FIG. 6 illustrates a block diagram of some additional embodiments of an EUV radiation source having multiple angled primary and pre-pulse lasers.

FIG. 6 illustrates a block diagram of some additional embodiments of an extreme ultraviolet (EUV) radiation source 600 having multiple angled primary and pre-pulse lasers. Although FIG. 6 is illustrated as having two angled primary and pre-pulse lasers, it will be appreciated that the disclosed EUV radiation source 600 is not limited to two primary and pre-pulse lasers. Rather, the disclosed EUV radiation source may comprise more than two primary and pre-pulse lasers.

The EUV radiation source 600 comprises a first pre-pulse laser 302a configured to generate a first pre-pulse laser beam 304a that intersects a first tin droplet trajectory of a first plurality of tin droplets 204a at a non-perpendicular angle. The EUV radiation source 600 further comprises a second pre-pulse laser 302b configured to generate a second pre-pulse laser beam 304b that intersects a second tin droplet trajectory of a second plurality of tin droplets 204b at a non-perpendicular angle. In some embodiments, a trajectory of the first pre-pulse laser beam 304a is different than a trajectory of the second pre-pulse laser beam 304b. For example, the first pre-pulse laser beam 304a may intersect the first tin droplet trajectory at an obtuse angle, while the second pre-pulse laser beam 304b may intersect a second tin droplet trajectory at an acute angle. In other embodiments, the trajectories of the first pre-pulse laser beam 304a and second pre-pulse laser beam 304b may be the same (i.e., parallel).

Figure 7:
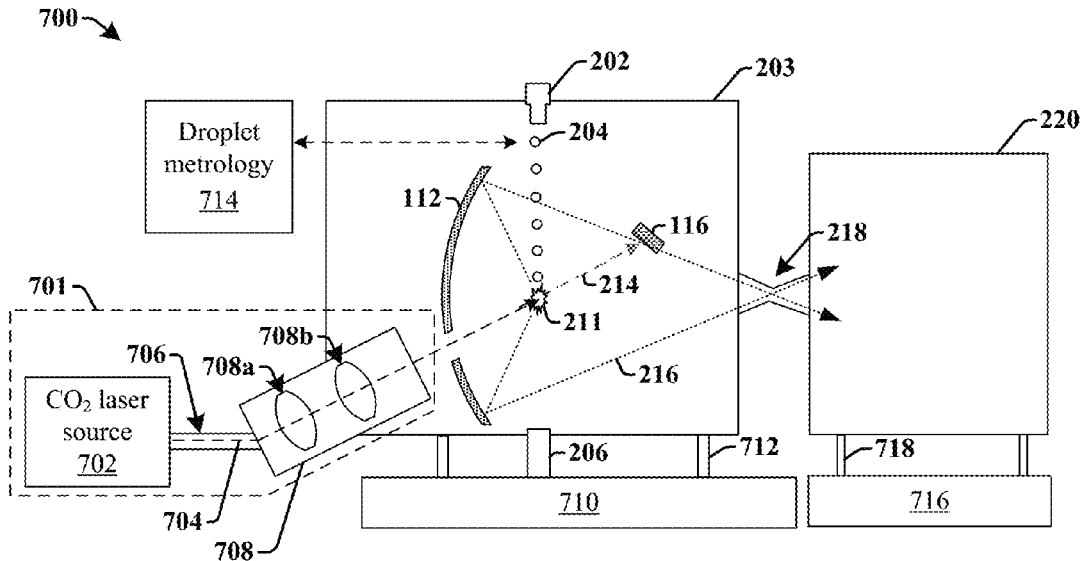
FIG. 7 illustrates a block diagram of some embodiments of an EUV photolithography system.

FIG. 7 illustrates a block diagram of some additional embodiments of an EUV lithography system 700.

The EUV lithography system 700 comprises a primary laser 701 having a $CO_2$ laser source 702 configured to produce a laser beam 704. In some embodiments, the $CO_2$ laser source 702 may comprise a multi-stage laser having a plurality of stages configured to amplify laser light produced by a prior stage. The laser beam 704 passes through a beam transport system 706 configured to provide the laser beam to a focusing system 708. The focusing system 708 comprises one or more lenses 708a, 708b and/or mirrors arranged within a beam line and configured to focus the laser beam 704. The laser beam 704 is output from the focusing system 708 to an EUV source vessel 203. In some embodiments, the EUV source vessel 203 may be coupled to an underlying source pedestal 710 by one or more damping elements 712.

The laser beam 704 follows a second trajectory that intersects a plurality of tin droplets 204 provided from a tin droplet generator 202, located within a ceiling of the EUV source vessel 203, to form a plasma 211 that emits EUV radiation 216. The EUV radiation 216 is reflected by a collector mirror 112 to an intermediate focus 218 that provides a connection to a scanner 220. In some embodiments, the EUV lithography system 700 may comprise a droplet metrology system 714 configured to determine the position and/or trajectory of the plurality of tin droplets 204. In some embodiments, the information from the droplet metrology system 714 may be provided to the focusing system 708, which can make adjustments to the position of the laser beam 704 to intersect the first trajectory of the plurality of tin droplets 204.

The scanner 220 comprises an optical train having a plurality of optical elements (e.g., lenses and/or mirrors) configured to scan the EUV radiation 216 along a surface of a semiconductor workpiece. The optical train of the scanner 220 may be held under vacuum (e.g., at a pressure of less than $10^{-2}$ mbar) to avoid attenuation of the EUV radiation 216. In some embodiments, the scanner 220 may be coupled to an underlying scanner pedestal 716 by one or more damping elements 718.

Figure 8:
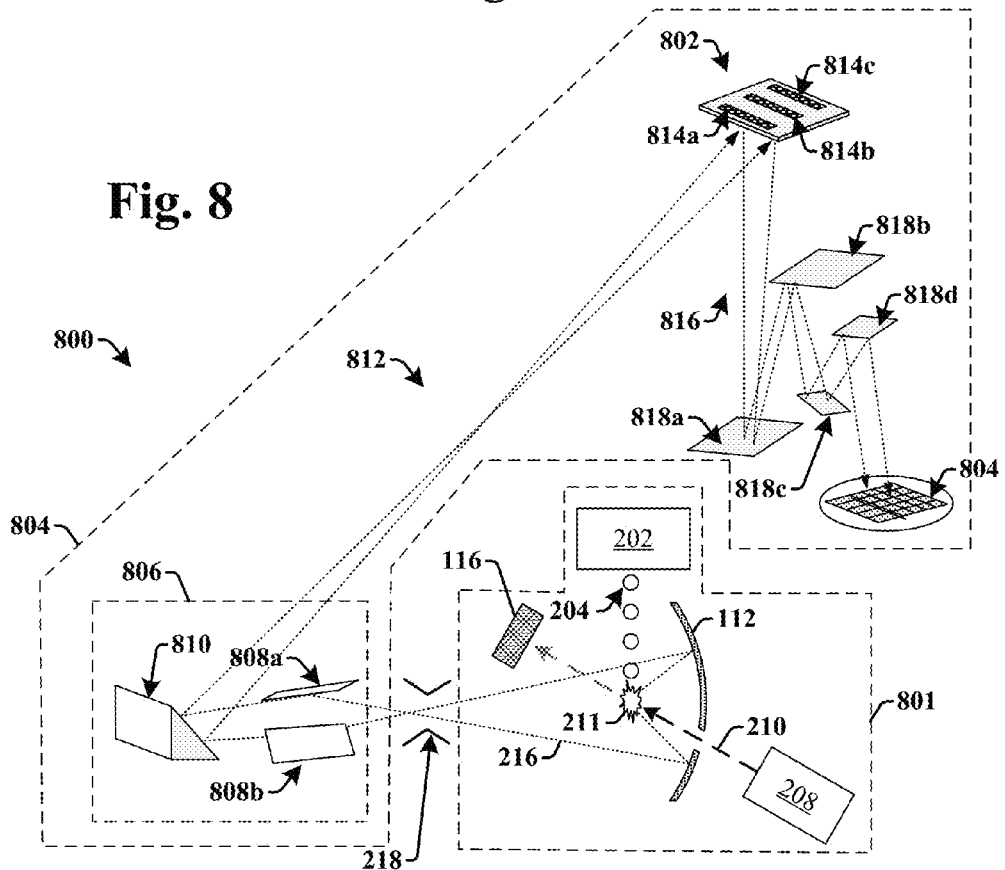
FIG. 8 illustrates a block diagram of some additional embodiments of an EUV photolithography system.

FIG. 8 illustrates a block diagram of some additional embodiments of an EUV photolithography system 800. Although the EUV photolithography system 800 is illustrated as having a certain configuration of components, it will be appreciated that the disclosed EUV radiation source may be implemented in EUV photolithography systems having additional components (e.g., additional mirrors) or having less components (e.g., less mirrors).

The EUV photolithography system 800 comprises EUV radiation source 801 configured to supply EUV radiation 216 (i.e., with wavelengths in a range of between about 10 nm and about 130 nm) to an EUV photomask 802 having a patterned multi-layered reflective surface (e.g., comprising alternating layers of molybdenum and silicon). In some embodiments, the EUV radiation source 801 is configured to generate the EUV radiation 216 by hitting tin droplets 204 with a primary laser beam 210 to generate a plasma 211 comprising ions that emit photons at a wavelength of between approximately 10 nm and approximately 130 nm.

The EUV radiation 216 output from the EUV radiation source 801 is provided to a condenser 806 by way of an intermediate focus 218. In some embodiments, the condenser 806 comprises first and second surfaces, 808a and 808b, configured to focus the EUV radiation 216, and a reflector 810 configured to reflect the EUV radiation 812 towards the EUV photomask 802. The EUV photomask 802 is configured to reflect the EUV radiation 812 to form a pattern on a surface of a semiconductor workpiece 804. To produce the pattern, the EUV photomask 802 comprises a plurality of absorptive features 814A-814C arranged on a front surface of the EUV photomask 802. The plurality of absorptive features 814A-814C are configured to absorb the EUV radiation 812, such that the reflected rays of EUV radiation 816 conveys a patterned defined by the EUV photomask 802.

The EUV radiation 816 is filtered through reduction optics comprising a series of first through fourth mirrors 818a-818d, which serve as lenses to reduce a size of the pattern carried by the EUV radiation 816. The fourth mirror 818d conveys the EUV radiation 816 onto a on a layer of photoresist disposed on a surface of the semiconductor workpiece 804. The EUV radiation patterns the layer of photoresist so that subsequent processing can be performed on selected regions of the semiconductor workpiece 804.

Figure 9:
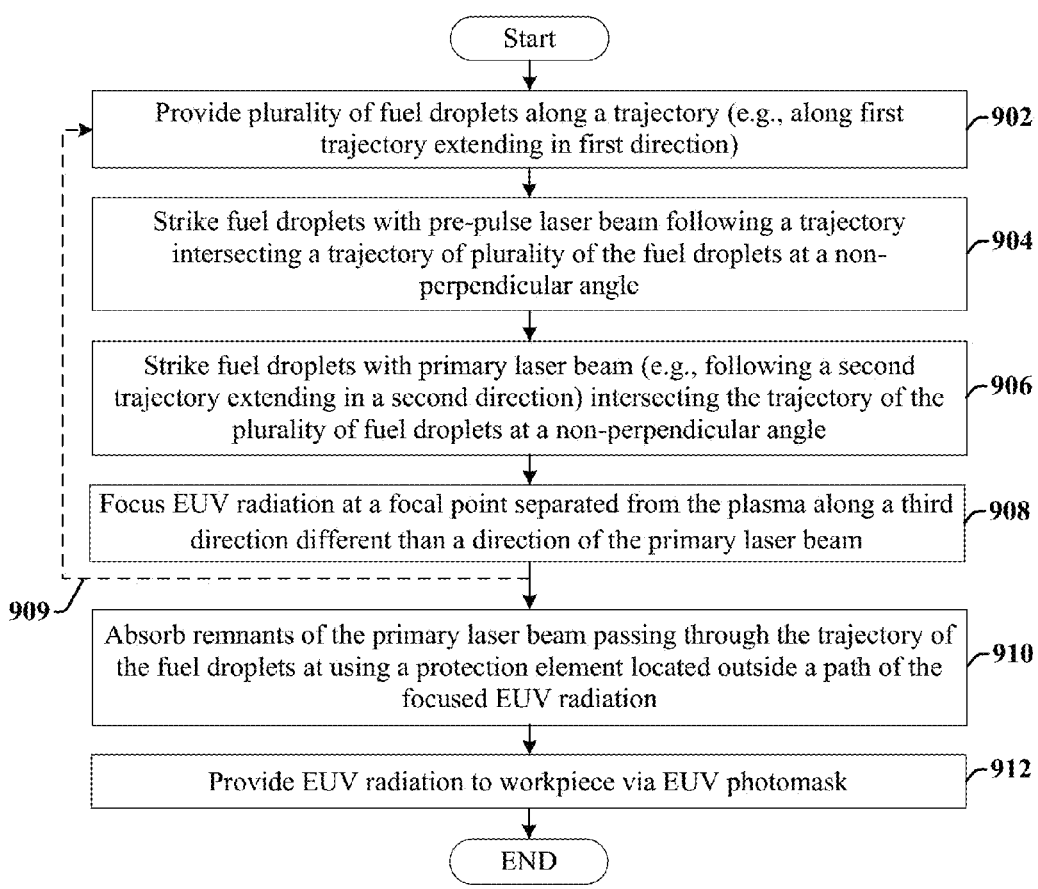
FIG. 9 illustrates a flow diagram of some embodiments of a method of performing an EUV photolithography process.

FIG. 9 illustrates a flow diagram of some embodiments of a method 900 of performing an EUV photolithography process.

While the disclosed method 900 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 902, a plurality of fuel droplets are provided along a trajectory. The plurality of fuel droplets may be provided along a first trajectory extending in first direction. In some embodiments, the plurality of fuel droplets may comprise tin droplets.

At 904, one or more of the plurality of fuel droplets may be struck with a pre-pulse laser extending along a trajectory intersecting the trajectory of the plurality of fuel droplets at a non-perpendicular angle, in some embodiments. The pre-pulse laser is configured to change the shape of the fuel droplets.

At 906, one or more of the plurality of fuel droplets are struck with a primary laser beam intersecting the trajectory of the plurality of fuel droplets at a non-perpendicular angle. In some embodiments, the primary laser beam follows a second trajectory extending in second direction and intersecting the first trajectory at a second non-perpendicular angle. The primary laser beam ignites a plasma from the fuel droplets that emits extreme ultraviolet (EUV) radiation. In some embodiments, the primary laser beam may comprise a laser beam generated by a carbon dioxide ($CO_2$) laser.

At 908, the EUV radiation is focused at a focal point not intersecting a line of the laser beam. In some embodiments, the focal point is separated from the plasma along a third direction different than the second direction.

In some embodiments, one or more of acts 902-908 may be concurrently repeated (illustrated by line 909) by different pre-pulse and/or primary lasers, so as to increase an amount of EUV radiation generated by the method 900. For example, a second plurality of fuel droplets may be provided (at act 902), struck by a second pre-pulse laser (at act 904) and by a second primary laser (at act 906). The radiation generated by the second primary laser may be subsequently focused at the focal point (at act 908), where the radiation generated by the second primary laser is added to radiation generated by other iterations of acts 902-908.

At 910, remnants of the primary laser beam passing through the trajectory of the fuel droplets are absorbed by a protection element located outside a path of the focused EUV radiation. Since the remnants of the primary laser beam are absorbed by a protection element located outside a path of the focused EUV radiation, the protection element does not block the EUV radiation from entering into downstream EUV optics, thereby increasing the power output and throughput of the EUV photolithography system.

At 912, the EUV radiation is provided to a workpiece via an EUV photomask (e.g., reticle) having a patterned multi-layered reflective surface (e.g., comprising alternating layers of molybdenum and silicon).

Therefore, the present disclosure relates to a photolithography radiation having an angled primary laser beam configured to generate improved power, and an associated method.

In some embodiments, the present disclosure relates to a photolithography radiation source. The photolithography radiation source comprises a fuel droplet generator configured to provide a plurality of fuel droplets to a source vessel along a first trajectory. A primary laser is configured to generate a primary laser beam along a second trajectory that intersects the first trajectory. The primary laser beam is configured to ignite a plasma from the plurality of fuel droplets that emits radiation. A collector mirror is configured to focus the radiation to an exit aperture of the source vessel. The primary laser beam does not intersect the exit aperture.

In other embodiments, the present disclosure relates to a photolithography radiation source. The photolithography radiation source comprises a fuel droplet generator configured to provide a plurality of fuel droplets to a source vessel, and a collector mirror having an opening that extends through the collector mirror at a location offset from a center of the collector mirror. A primary laser is configured to generate a primary laser beam extending through the opening. The primary laser beam is configured to ignite a plasma from the plurality of fuel droplets that emits radiation.

In yet other embodiments, the present disclosure relates to a photolithography system. The system comprises a fuel droplet generator configured to provide a plurality of fuel droplets to a source vessel along a first trajectory. A primary laser is configured to generate a primary laser beam along a second trajectory that intersects the first trajectory at a non-perpendicular angle. The primary laser beam is configured to ignite a plasma from the plurality of fuel droplets that emits radiation. A collector mirror is configured to focus the radiation to an exit aperture of the source vessel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photolithography radiation source, comprising:
a fuel droplet generator configured to provide a plurality of fuel droplets to a source vessel along a first trajectory;
a primary laser configured to generate a primary laser beam along a second trajectory that intersects the first trajectory, wherein the primary laser beam is configured to ignite a plasma from the plurality of fuel droplets that emits radiation;
a collector mirror configured to focus the radiation to an exit aperture of the source vessel along a focal path, wherein the primary laser beam does not intersect the exit aperture; and
a protection element linearly aligned with the primary laser beam and configured to obstruct remnants of the primary laser beam passing through the plurality of fuel droplets, wherein the focal path is devoid of additional protection elements configured to obstruct a laser beam from intersecting the exit aperture.

2. The photolithography radiation source of claim 1, wherein the collector mirror has an opening extending through the collector mirror at a location that is offset from a center of the collector mirror.

3. The photolithography radiation source of claim 1, wherein the collector mirror is configured to focus the radiation at a focal point not intersecting the primary laser beam.

4. The photolithography radiation source of claim 1, further comprising:
an intermediate focus unit comprising a cone shaped aperture arranged within the exit aperture between the source vessel and a scanner comprising a plurality of mirrors configured to convey the radiation to a semiconductor substrate, wherein the intermediate focus unit comprises an unobstructed opening between the source vessel and the scanner.

5. The photolithography radiation source of claim 1, further comprising:
a second fuel droplet generator configured to provide a second plurality of fuel droplets to the source vessel along a third trajectory; and
a second primary laser configured to generate a second primary laser beam along a fourth trajectory that intersects the third trajectory, wherein the second primary laser beam does not intersect the exit aperture.

6. The photolithography radiation source of claim 5, further comprising:
a second protection element linearly aligned with the second primary laser beam and configured to obstruct remnants of the second primary laser beam passing through the third trajectory of the second plurality of fuel droplets, wherein the protection element and the second protection element are disposed on opposite sides of the exit aperture.

7. The photolithography radiation source of claim 1, wherein the exit aperture is not in line with the second trajectory of the primary laser beam.

8. A photolithography radiation source, comprising:
a fuel droplet generator configured to provide a plurality of fuel droplets to a source vessel along a first trajectory;
a collector mirror having an opening that extends through the collector mirror at a location offset from a center of the collector mirror;
a primary laser configured to generate a primary laser beam extending through the opening and intersecting the first trajectory at a first non-perpendicular angle, wherein the primary laser beam is configured to ignite a plasma from the plurality of fuel droplets that emits radiation;
a pre-pulse laser configured to generate a pre-pulse laser beam that intersects the first trajectory at a second non-perpendicular angle; and
a protection element configured to obstruct remnants of the primary laser beam passing through the plurality of fuel droplets, wherein the protection element is disposed outside a focal path of the collector mirror.

9. The photolithography radiation source of claim 8, wherein the collector mirror is configured to focus the radiation to an exit aperture of the source vessel that is not in line with a trajectory of the primary laser beam.

10. The photolithography radiation source of claim 9, further comprising:
an intermediate focus unit comprising a cone shaped aperture arranged within the exit aperture between the source vessel and a scanner comprising a plurality of mirrors configured to convey the radiation to a semiconductor substrate, wherein the intermediate focus unit comprises an unobstructed opening between the source vessel and the scanner.

11. The photolithography radiation source of claim 8, wherein the collector mirror is configured to focus the radiation at a focal point not intersecting the primary laser beam.

12. The photolithography radiation source of claim 8, wherein the collector mirror is configured to focus the radiation to an exit aperture of the source vessel; and wherein the primary laser beam does not intersect the exit aperture.

13. A photolithography system, comprising:
a fuel droplet generator configured to provide a plurality of fuel droplets to a source vessel along a first trajectory;
a primary laser configured to generate a primary laser beam along a second trajectory that intersects the first trajectory at a non-perpendicular angle, wherein the primary laser beam is configured to ignite a plasma from the plurality of fuel droplets that emits radiation;
a collector mirror configured to focus the radiation to an exit aperture of the source vessel along a focal path; and
a protection element configured to obstruct remnants of the primary laser beam passing by the plurality of fuel droplets, wherein the protection element is disposed outside the focal path and wherein additional protection elements configured to obstruct a laser beam from entering the exit aperture are not within the focal path.

14. The system of claim 13, wherein the primary laser beam does not intersect the exit aperture.

15. The system of claim 13, wherein the collector mirror is configured to focus the radiation at a focal point spatially offset from the second trajectory of the primary laser beam.

16. The system of claim 13, wherein the collector mirror has a concave curvature that is curved around an intersection of the first trajectory and the second trajectory.

17. The system of claim 13, further comprising:
a second fuel droplet generator configured to provide a second plurality of fuel droplets to the source vessel along a third trajectory; and
a second primary laser configured to generate a second primary laser beam along a fourth trajectory that intersects the third trajectory at a second non-perpendicular angle.

18. The system of claim 13, further comprising:
an intermediate focus unit comprising a cone shaped aperture arranged within the exit aperture between the source vessel and a scanner comprising a plurality of mirrors configured to convey the radiation to a semiconductor substrate, wherein the intermediate focus unit comprises an unobstructed opening between the source vessel and the scanner.

19. The photolithography radiation source of claim 6, wherein the second protection element is disposed outside the focal path of the radiation focused by the collector mirror to the exit aperture of the source vessel.

20. The system of claim 17, further comprising:
a second protection element linearly aligned with the second primary laser beam and configured to obstruct remnants of the second primary laser beam passing through the third trajectory of the second plurality of fuel droplets, wherein the second protection element is disposed outside the focal path of the radiation focused by the collector mirror to the exit aperture of the source vessel.

* * * * *